United States Patent [19]
Huber et al.

[11] Patent Number: 6,025,997
[45] Date of Patent: Feb. 15, 2000

[54] CHIP MODULE FOR SEMICONDUCTOR CHIPS HAVING ARBITRARY FOOTPRINTS

[75] Inventors: Michael Huber, Nittendorf; Peter Stampka, Schwandorf, both of Germany

[73] Assignee: Siemens Aktiengesellschaft, Munich, Germany

[21] Appl. No.: 09/071,797

[22] Filed: May 4, 1998

Related U.S. Application Data

[63] Continuation of application No. PCT/DE96/02050, Oct. 28, 1996.

[51] Int. Cl.$^7$ ............... H05K 1/18; H05K 7/02; H01L 23/48; H01L 23/50

[52] U.S. Cl. ............ 361/777; 235/492; 361/749; 361/760; 361/737

[58] Field of Search .................. 174/52.1, 52.4, 174/254, 260, 261; 235/492, 487, 488; 257/678, 679, 787, 735, 676, 723, 724; 361/749, 760, 774, 737, 777, 783; 439/68, 946; 902/26; 365/51, 52, 63

[56] References Cited

FOREIGN PATENT DOCUMENTS

| | | |
|---|---|---|
| 0 676 716 A1 | 10/1995 | European Pat. Off. . |
| 2 684 236 | 11/1991 | France . |
| 38 09 005 A1 | 9/1989 | Germany . |
| 42 32 625 A1 | 3/1994 | Germany . |
| 2 149 209 | 6/1985 | United Kingdom . |
| WO98/13870 | 4/1998 | WIPO .................... 361/737 |

*Primary Examiner*—Donald Sparks
*Attorney, Agent, or Firm*—Herbert L. Lerner; Laurence A. Greenberg

[57] ABSTRACT

A chip module has a contact layer made up of several electrically conductive contact elements. The contact elements have a front side with contact areas. A semiconductor chip is disposed above the contact layer. The semiconductor chip has a main area with a number of chip terminals that are electrically connected by means of bonding wires of a maximum mounting length to the back side of the respective contact elements. A thin insulating film of electrically insulating material is disposed between the contact layer and the semiconductor chip. The insulating film is formed with a multiplicity of bonding holes, which are arranged, shaped, numbered, and assigned to respective contact elements of the contact layer in such a way that, with any desired position and footprint of the attached semiconductor chip, an electrical bonding of the chip terminals with a respectively associated contact element of the contact layer is accomplished by means of the bonding wires.

17 Claims, 2 Drawing Sheets

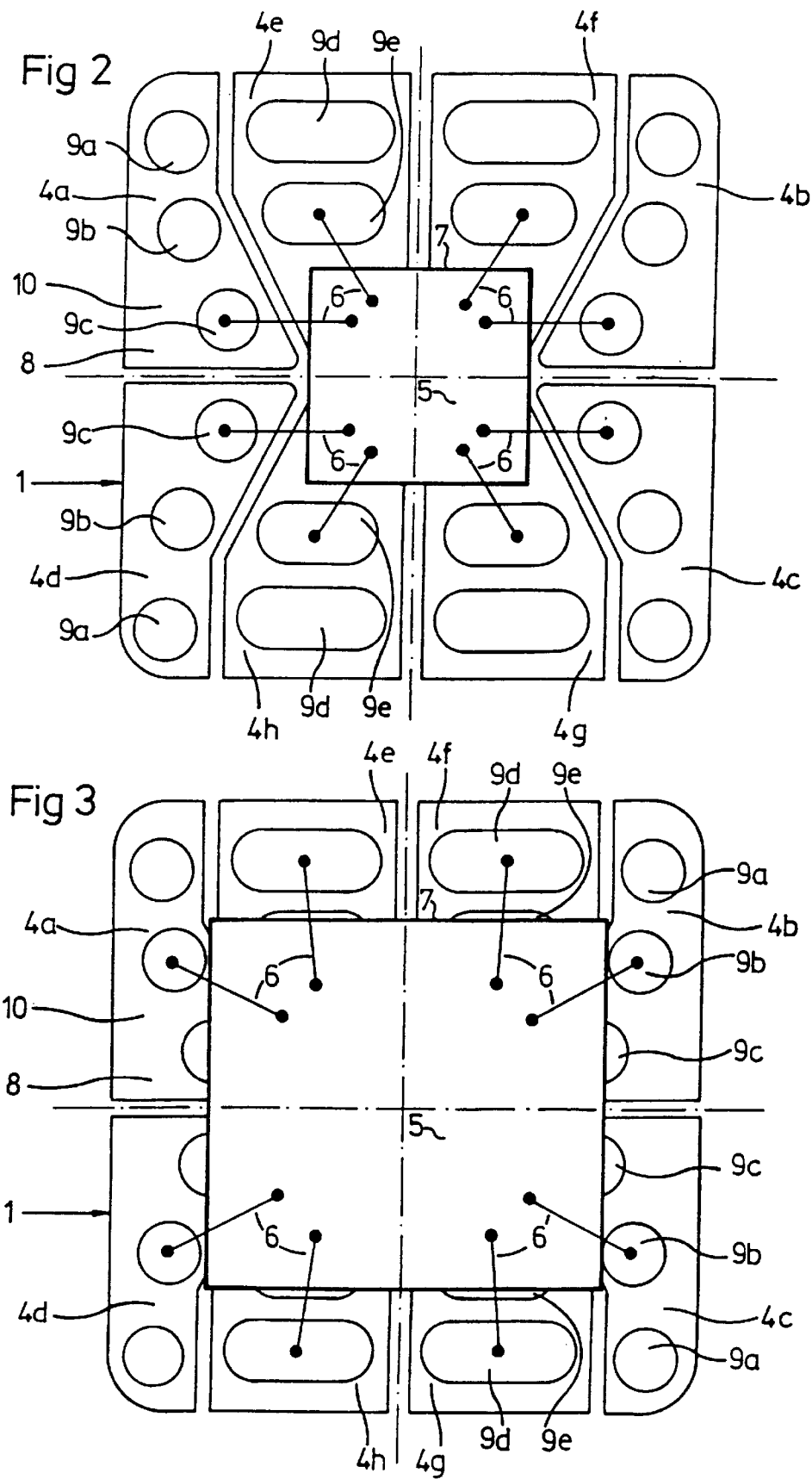

CHIP MODULE FOR SEMICONDUCTOR CHIPS HAVING ARBITRARY FOOTPRINTS

CROSS-REFERENCE TO RELATED APPLICATION

This is a continuation of copending international application PCT/DE96/02050, filed Oct. 28, 1996, which designated the United States.

BACKGROUND OF THE INVENTION

1. Field of the Invention

The invention pertains to a chip module with a contact layer made of electrically conductive material, a multiplicity of contact elements on the front side with contact areas, and a semiconductor chip disposed above the contact layer. The semiconductor chip has chip terminals, which are arranged on a main area of the semiconductor chip and are electrically connected via bonding wires to the back side of the contact element assigned to the chip terminal. The chip module is to be installed in particular into a chip card.

Chip cards have manifold application purposes. They are generally made in check card format and they have become extremely varied on account of thei high functional flexibility and, with the increasing computing power and storage capacity of the available integrated circuits, their use continues to increase. Apart from the currently typical field of application of such chip cards in the form of cards for medical insurance policyholders, flexitime acquisition cards and phonecards, in future there will be in particular applications in electronic payment systems, for computerized access control, for protected data memories and the like. Various possibilities exist currently for producing chip cards. In most methods, the actual semiconductor chip is initially mounted onto a chip card module, which also comprises the usually gold-plated card contacts. The chip card modules are usually produced on a continuous tape or continuous substrate, the individual chip card modules are subsequently punched out and introduced into the chip card. In this method, no direct attachment of the chip in the card takes place. This has the advantage that the flexural forces and shear forces which may occur under mechanical loading of the chip card are largely kept away from the chip. In the production of chip card modules, most often used at present is the so-called wire-bonding method, upon which the module according to the invention is also based. Such wire bonding is disclosed, for example, in French disclosure FR 2 684 236 A1, in British specification GB 2 149 209 A, and in German disclosures DE 42 32 625 A1 and DE 38 09 005 A1. There, the chip terminals of the semiconductor chip bearing the actual electronic circuit are connected by thin bonding wires to the individual contact elements of the contact layer. For protection against environmental influences, the semiconductor chip and the bonding wires are covered with a casting composition. The advantage of that production process is that it is based largely on the processes which are customary in the semiconductor industry for packing chips in standard packages. As a result the process is less expensive. The main disadvantage of the method is that both the overall height and the length and width of the module turn out to be much greater than, for example, in the case of the so-called TAB module, in which the terminal areas (pads) of the semiconductor chip are provided with electrodeposited metallic humps, which serve for the direct attachment of the electrically conductive contact areas by solder connection. There it is consequently not necessary to cover the bonding wires.

For the incorporation of the chip module in the chip card, currently three different methods have become established, the laminating method, insertion into milled cavities, and mounting in ready injection-molded cards. In all the methods of incorporation, the card producer faces the disadvantage of having to insert into the card chip card modules of different overall sizes, which result from the different chip area of the semiconductor chip used. The diversity of modules resulting from different chip areas of, typically, about 1 mm² to 20 mm², also causes the module producer to incur increased material costs owing to reduced delivery volume per module variant and increased expenditure on logistics. Owing to the different module types, the card producer is faced with different dimensions of the card cavities for the incorporation of the module and consequently with increased tool costs and process costs.

SUMMARY OF THE INVENTION

It is accordingly an object of the invention to provide a chip card module, which overcomes the above-mentioned disadvantages of the prior art devices and methods of this general type and which provides for a universally usable chip module for incorporation into any desired semiconductor chip device, in particular into a chip card, which has a uniform overall size irrespective of the chip size of the semiconductor chip used, whereby it should be possible to produce the chip module with extra expenditure or extra costs which are only slightly higher, if higher at all.

With the foregoing and other objects in view there is provided, in accordance with the invention, a chip module, comprising:

a contact layer made of electrically conductive material, the contact layer having a multiplicity of contact elements formed with contact areas on a front side thereof;

a semiconductor chip disposed on the contact layer, the semiconductor chip having a given number of chip terminals formed on a main area thereof;

a thin insulating film of electrically insulating material disposed between the electrically conductive contact layer and the semiconductor chip, the insulating film having a multiplicity of bonding holes formed therein exceeding the given number of chip terminals;

bonding wires electrically connecting each of the chip terminals through the bonding holes to a back side of a respective the contact element;

the bonding holes being formed in accordance with a defined arrangement, shape, number and assignment to a respective the contact element such that, with any arbitrary position and any arbitrary footprint of the semiconductor chip, the chip terminals are electrically bonded with the bonding wires through a respective the bonding hole to the respectively associated contact element.

In accordance with the invention, the bonding wires have a defined maximum mounting length, and a thin insulating film is disposed between the electrically conductive contact layer and the semiconductor chip. The thin insulating film is formed of electrically insulating material and has formed therein a multiplicity of bonding holes which exceed the number of chip terminals. The bonding holes are formed with regard to their arrangement, shape, number and assignment to a particular contact element of the contact layer in such a way that, with any desired position and in particular any desired base area (footprint) of the attached semiconductor chip, an electrical bonding of the chip terminals with a respectively associated contact element of the contact layer can be accomplished by means of the bonding wires while conforming to the applicable mounting regulations for the bonding wires. The invention makes possible a universally usable module of uniform outer dimensions, which are independent of the size of the semiconductor chip respectively used. As a result, both in the production of the chip module and in the incorporation of the module into the chip card, considerable production costs can be saved and the expenditure on logistics can be reduced in both areas.

Following the principle of the invention, it is a preferred embodiment of the invention if the thin insulating film is punched out at the locations of the bonding holes and/or at the location where the semiconductor chip is to be attached on the chip module. Otherwise the film is formed such that it is closed virtually continuously over the entire surface area of the contact layer. The chip module according to the invention can be used in the case of all contact layers to the ISO Standard which are currently in use. Six or eight contact elements are currently a customary number in most cases.

In accordance with an added feature of the invention, the thin insulating film has at least two bonding boles formed therein for each assigned contact element.

In accordance with an additional feature of the invention, the bonding wires have a maximum mounting length of about 3 mm.

In accordance with another feature of the invention, there is provided a carrier of electrically insulating material supporting the contact layer, the insulating film, and the semiconductor chip. The carrier is preferably a frame disposed about a border region of the contact layer which surrounds the semiconductor chip. In accordance with again another feature of the invention, the carrier is made of glass epoxy material and has a thickness of up to 125 $\mu$m. Particularly in the case of semiconductor chips which have a large surface area, and are therefore more fragile, a reinforcing frame surrounding the chip may be additionally applied on the insulating film.

In accordance with again an added feature of the invention, the insulating film between the contact layer and the semiconductor chip has a thickness of less than 30 $\mu$m. In comparison with the layer thicknesses used for the metallic contact layer and the carrier of electrically insulating material, therefore, the thin insulating film between the electrically conductive contact layer and the semiconductor layer may be of a significantly smaller thickness, as long as there is an adequate electrical insulating effect of the insulating film.

As noted above, the thin insulating film of a particularly preferred embodiment is formed with two or more bonding holes per assigned contact element. If necessary, the precise geometry, arrangement and number of the bonding holes can be varied for each contact element of the contact area, according to the arrangement and geometry of the contact pad with the contact elements. This arrangement is generally predetermined to meet ISO Standards, and is implemented according to the chip types actually used, while taking into account the currently applicable mounting regulations with regard to the bonding wires, which have a maximum mounting length. At the same time, if an adhesive is used for attaching the semiconductor chip into the card module, steps must be taken to avoid an undesired bleed of the adhesive through the bonding holes onto the back side of the contact element assigned to the chip terminal. This may be achieved by suitable shaping and arrangement of the bonding holes of the same contact element in that the edge borders of a bonding hole have an adhesive effect to act as it were as a flow stop for the adhesive agent, so that there is no need for a separately provided "bleed stop" to prevent an undesired application of adhesive.

In accordance with again a further feature of the invention, the semiconductor chip is adhesively bonded into the chip module with an electrically insulating adhesive.

Adhesively bonding the semiconductor chip to the chip module with an electrically insulating adhesive, prevents an electrical short circuit over the contacts of the reader through the layer of adhesive. By use, say, a non-Ag-filled insulating adhesive with a thermal conductivity $\lambda$ of approximately 5 W/mK, together with the highly thermally insulating thin insulating film or insulating layer, a much improved delamination behavior with regard to a so-called hot-melt incorporation method can be ensured even without providing a chip island.

The thin insulating film has primarily the function of acting as an electrically insulating layer between the semiconductor chip and the contact layer. In addition, in the case of a further preferred configuration of the invention, the thin insulating film has a function ensuring the connection between the semiconductor chip and the contact layer. In this respect, the thin insulating film is intended on the one hand to ensure a good bond over as full a surface area as possible with respect to the metallic contact layer and on the other hand to ensure on the side facing the other way a good bond with respect to the semiconductor chip or with respect to the epoxy tape. Furthermore, it is intended that the adhesive or bonding connection with respect to the semiconductor chip and with respect to the metal layer by means of the thin insulating film can be established quickly and simply and has adequate long-term stability.

In accordance with yet a further feature of the invention, the thin insulating film is a bonding or adhesive layer and the bonding/adhesive property thereof may depend on a mechanical pressure applied thereto. The thin insulating film may thus have the function of a layer of pressure-sensitive adhesive such that the roll pressure produced during the laminating-on of the contact layer and of the epoxy tape produces in the layer of pressure-sensitive adhesive or insulating film a shear stress produced perpendicularly to the line or direction of the effective force vector. In this direction, the layer of adhesive is made microplastic, preferably by a corresponding orientation of molecular chains within the adhesive layer. This is adequate for producing a microstructuring and consequently an adaptation of the surface of the layer of adhesive to the respective element to which it is being connected and consequently to ensure an adequate bonding strength. Examples of suitable materials for thin insulating films of such a kind, which are suitable as a layer of pressure-sensitive adhesive, are acrylates, natural substances (for example unvulcanized rubbers), silicones, styrene copolymers (for example butadienes), isoprenes and the like. At the same time, the insulating film, acting as a layer of pressure-sensitive adhesive, may be both of a single-ply form and of a multi-ply form. In the case of a multi-ply structure, a middle ply may assume the carrier function for the individual layers of adhesive. Thermoplastic films are suitable in particular for the middle ply, for performing the carrier function. Use of the thin insulating film also as an adhesive layer for the semiconductor chip renders it unnecessary to apply a further chip adhesive. Such additional chip adhesives, which are generally applied in a liquid or viscous consistency, generally have the disadvantage that, if they are incorrectly metered or if there are irregularities in the process, production downtimes may result. If the metering of the chip adhesive is too high, there is for example the risk of some of the bonding holes necessary for the electrical bonding to become clogged, which would make them unusable, whereas, if the metering of the adhesive on the thin insulating film is too low, then the chip is inadequately fixed on the perforated substrate. Moreover, when a liquid chip adhesive is being applied there is the risk of changing the shape and position of the required bonding holes, which in turn may result in increased production downtimes or make a greater level of process monitoring necessary.

Other features which are considered as characteristic for the invention are set forth in the appended claims.

Although the invention is illustrated and described herein as embodied in chip module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a diagrammatic plan view of a chip module according to an exemplary embodiment of the invention with a semiconductor chip of small surface area; and FIG. 3 is a diagrammatic plan view of a chip module according to a further exemplary embodiment of the invention with a semiconductor chip of large surface area.

DESCRIPTION OF THE PREFERRED EMBODIMENTS

Figure 1:
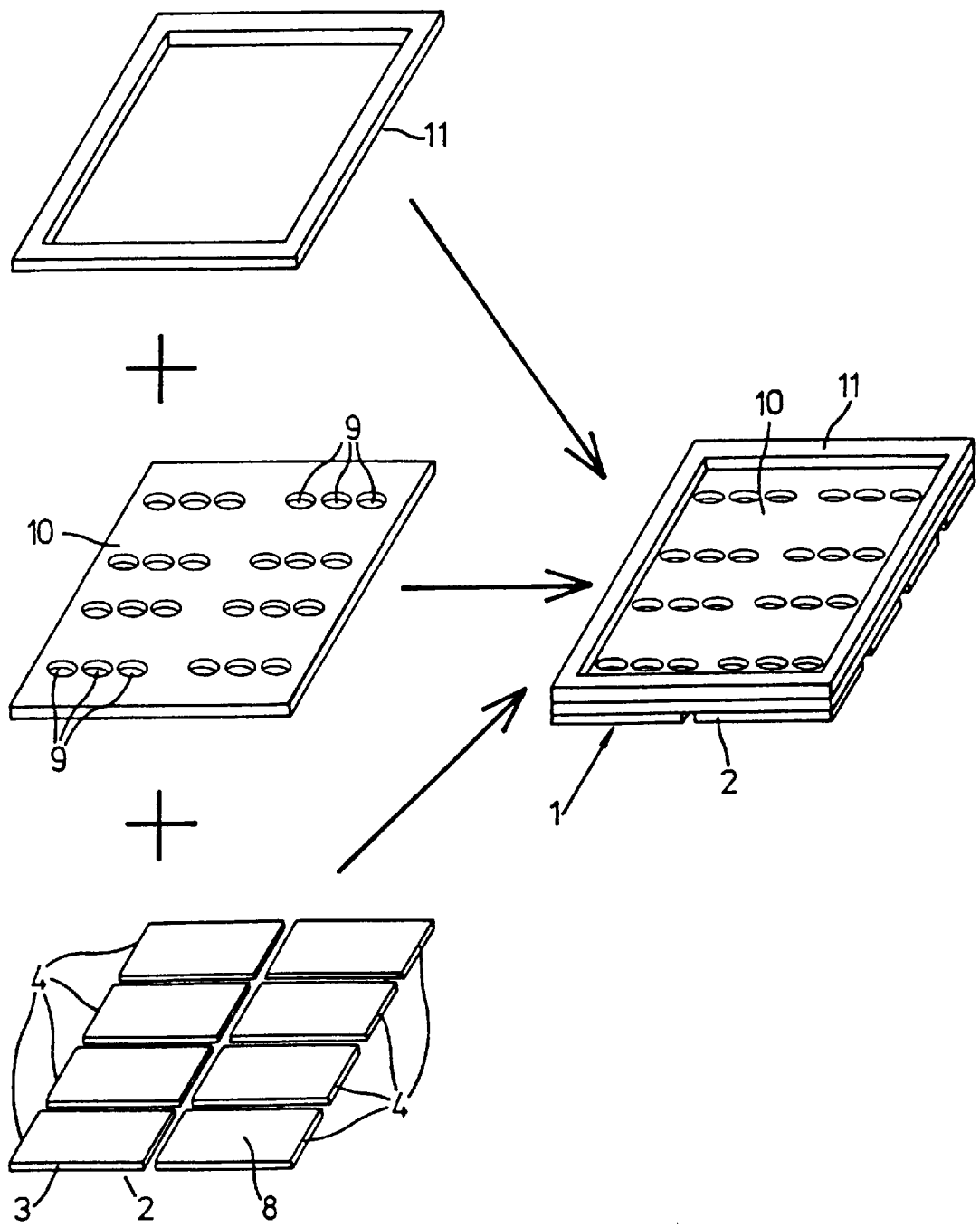
FIG. 1 is a perspective diagrammatic view of the chip module according to the invention with the three component parts of a contact layer with contact elements, a thin insulating film, and a carrier of electrically insulating material, in an exploded view and an assembled view.

Referring now to the figures of the drawing in detail and first, particularly, to FIG. 1 thereof, there is seen a metallic contact layer 2, provided with dimensions generally standardized to an ISO Standard. The contact layer 2 has a thickness of about 30 $\mu$m to about 70 $\mu$m and it is formed of contact elements 4 with contact areas 3 at the front. A semiconductor chip 7 (FIGS. 2, 3) is to be attached in the chip module and has on its main area 5 chip terminals or pad terminal areas (not shown in any more detail for the sake of overall clarity), which are electrically connected by means of bonding wires 6 to the back side 8 of the contact element 4 assigned to the respective chip terminal.

A thin insulating film 10 of electrically insulating material is disposed between the electrically conductive contact layer 2 and the semiconductor chip 7 in accordance with the invention. The film 10 is formed with a multiplicity of bonding holes 9. The bonding holes 9 are made with regard to arrangement, shape, number and assignment to a particular contact element 4 of the contact layer 2 in such a way that, with any desired position and base area of the attached semiconductor chip 7, electrical bonding of the chip terminals with a respectively associated contact element 4 of the contact layer 2 can be accomplished by means of the bonding wires 6 while conforming to the currently applicable mounting regulation, i.e. predetermined maximum bonding wire lengths.

As shown in the figures, the thin insulating film 10 is punched out at the locations of the bonding holes 9, and is otherwise formed such that it is closed virtually continuously over the entire surface area of the contact layer 2. In an alternative embodiment, which is not shown in any more detail in the figures, the thin insulating film 10 may additionally be provided, at the location of the semiconductor chip 7 to be attached, with a punch-out corresponding to the base area of the semiconductor chip 7. In that case, the semiconductor chip can be placed into the punch-out provided in the insulating film and be attached directly on the back side 8 of the contact layer 2, for example by die bonding.

As seen in FIG. 1, there may be provided a carrier 11 of glass epoxy material. The carrier 11 frames the border region of the contact layer 2 and surrounds the semiconductor chip 7, and it also serves as a supporting frame for the chip module. The carrier 11 may be provided with adhesive areas, by way of which it is mounted into a cavity (e.g. milled depression) of a chip card.

FIGS. 2 and 3 show in diagrammatic plan views closer details of a particularly preferred exemplary embodiment of the invention. Here, the chip module 1 has a contact layer 2 with eight contact elements 4a to 4h. A semiconductor chip 7a with a relatively small surface area is mounted according to FIG. 2, and a semiconductor chip 7b of a relatively large surface area is mounted according to FIG. 3. The bonding holes 9 of the thin insulting film 10 are made such that, for the contact elements 4a to 4d, there are respectively provided three bonding holes 9a, 9b, 9c of circular cross-sectional shape, the successive arrangement of the center points of which essentially follows approximately the shaping of the associated contact element, and for the contact elements 4e to 4h there are respectively provided two bonding holes 9d, 9e of elongate cross-sectional shapes, the dimensions of the bonding hole in the longitudinal extent increasing with increasing distance from the center of the contact layer.

In this way, an electrical bonding of the chip terminals with a respectively associated contact element can be accomplished by means of the bonding wires 6—irrespective of the base area of the semiconductor chip— by means of a favorably situated bonding hole.

We claim:

1. A chip module, comprising:
   a contact layer made of electrically conductive material, said contact layer having a multiplicity of contact elements electrically insulated from one another and formed with contact areas on a front side thereof;
   a semiconductor chip disposed on said contact layer, said semiconductor chip having a given number of chip terminals formed on a main area thereof;
   a thin insulating film of electrically insulating material disposed between said electrically conductive contact layer and said semiconductor chip, said insulating film having a respective multiplicity of bonding holes formed therein for each respective one of said contact elements, a total number of said bonding holes exceeding the given number of chip terminals;
   bonding wires electrically connecting each of said chip terminals through said bonding holes to a back side of a respective said contact element;
   said bonding holes being formed in accordance with a defined arrangement, shape, number and assignment to a respective said contact element such that, with any arbitrary position and any arbitrary footprint of said semiconductor chip, each respective one of said chip terminals is electrically bonded with a respective one of said bonding wires guided through a single bonding hole of said respective multiplicity of bonding holes to the respectively associated contact element.

2. The chip module according to claim 1, wherein said thin insulating film has at least two bonding holes formed therein for each assigned contact element.

3. The chip module according to claim 1, wherein said bonding wires have a maximum mounting length.

4. The chip module according to claim 1, wherein said bonding wires have a maximum mounting length of about 3 mm.

5. The chip module according to claim 1, which further comprises a carrier of electrically insulating material supporting said contact layer, said insulating film, and said semiconductor chip.

6. The chip module according to claim 5, wherein said carrier is a frame disposed about a border region of said contact layer and surrounds said semiconductor chip.

7. The chip module according to claim 5, wherein said carrier is made of glass epoxy material and said carrier has a thickness of up to 125 $\mu$m.

8. The chip module according to claim 1, wherein said insulating film between said contact layer and said semiconductor chip has a thickness of less than 30 $\mu$m.

9. The chip module according to claim 1, wherein said semiconductor chip is adhesively bonded into the chip module with an electrically insulating adhesive.

10. The chip module according to claim 1, wherein said contact layer has six contact elements.

11. The chip module according to claim 1, wherein said contact layer has eight contact elements.

12. The chip module according to claim 1, wherein said bonding holes are punched out of said insulating film, and said insulating film is substantially continuously closed over an entire surface area of the contact layer except for said bonding holes.

13. The chip module according to claim 1, wherein said bonding holes are punched out of said insulating film, and said insulating film is formed with an opening at a location where said semiconductor chip is bonded into the chip module, said insulating film being substantially continuously closed over an entire surface area of the contact layer except for said bonding holes and said opening for said semiconductor chip.

14. The chip module according to claim 1, wherein said thin insulating film is a bonding layer.

15. The chip module according to claim 14, wherein a bonding property of said bonding layer depends on a mechanical pressure applied thereto.

16. The chip module according to claim 1, wherein said thin insulating film is formed of adhesive material.

17. The chip module according to claim 16, wherein an adhesive property of said insulating film depends on a mechanical pressure applied thereto.

* * * * *

UNITED STATES PATENT AND TRADEMARK OFFICE
CERTIFICATE OF CORRECTION

PATENT NO. : 6,025,997
DATED : February 15, 2000
INVENTOR(S) : Michael Huber, Peter Stampka It is certified that error appears in the above-identified patent and that said Letters Patent is hereby corrected as shown below:

On the title page item [30], should be inserted to read as follows:

-- Nov. 3, 1995 [DE] Germany.......... 195 41 072 --.

Signed and Sealed this

Seventh Day of November, 2000

Attest:

Q. TODD DICKINSON

Attesting Officer

Director of Patents and Trademarks